(12) United States Patent
Chang et al.

(10) Patent No.: US 12,206,047 B2
(45) Date of Patent: Jan. 21, 2025

(54) LIGHT-EMITTING DIODE CHIP AND ULTRAVIOLET LIGHT-EMITTING DEVICE INCLUDING THE SAME

(71) Applicant: Xiamen Sanan Optoelectronics Technology Co., Ltd., Xiamen (CN)

(72) Inventors: Poyang Chang, Xiamen (CN); Linrong Cai, Xiamen (CN); Shao-Hua Huang, Xiamen (CN); Liqin Zhu, Xiamen (CN); Shuangliang Liu, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 443 days.

(21) Appl. No.: 17/677,712

(22) Filed: Feb. 22, 2022

(65) Prior Publication Data
US 2022/0278252 A1 Sep. 1, 2022

(30) Foreign Application Priority Data

Mar. 1, 2021 (CN) .......................... 202120438721.6

(51) Int. Cl.
| | | |
|---|---|---|
| H01L 21/00 | (2006.01) | |
| H01L 33/22 | (2010.01) | |
| H01L 33/38 | (2010.01) | |
| H01L 33/60 | (2010.01) | |
| H01L 33/62 | (2010.01) | |
| H01L 33/32 | (2010.01) | |

(52) U.S. Cl.
CPC ............ H01L 33/22 (2013.01); H01L 33/382 (2013.01); H01L 33/60 (2013.01); H01L 33/62 (2013.01); *H01L 33/32* (2013.01); *H01L 2933/0091* (2013.01)

(58) Field of Classification Search
CPC ....... H01L 33/22; H01L 33/382; H01L 33/60; H01L 33/62; H01L 33/32
See application file for complete search history.

(56) References Cited

U.S. PATENT DOCUMENTS

| | | | | |
|---|---|---|---|---|
| 8,324,082 B1 * | 12/2012 | Liu | ...................... | H01L 33/486 438/459 |
| 10,043,850 B2 * | 8/2018 | Lin | ........................ | H01L 33/32 |
| 2007/0018187 A1 * | 1/2007 | Lee | ......................... | H01L 33/22 438/27 |

FOREIGN PATENT DOCUMENTS

KR 10-1039610 * 6/2011

* cited by examiner

*Primary Examiner* — Richard A Booth
(74) *Attorney, Agent, or Firm* — Thomas | Horstemeyer LLP.

(57) ABSTRACT

A light-emitting diode (LED) chip includes a substrate and an epitaxial structure. The epitaxial structure includes a first semiconductor layer, an active layer and a second semiconductor layer that are sequentially disposed on the substrate in such order. The second semiconductor layer has a light-emitting surface that is opposite to the active layer and that is formed with a microstructure. The microstructure includes a plurality of first protrusions that are separately disposed on the light-emitting surface, and a plurality of second protrusions that are disposed on the first protrusions and on the light-emitting surface between any two adjacent ones of the first protrusions.

17 Claims, 4 Drawing Sheets

LIGHT-EMITTING DIODE CHIP AND ULTRAVIOLET LIGHT-EMITTING DEVICE INCLUDING THE SAME

CROSS-REFERENCE TO RELATED APPLICATION

This application claims priority of Chinese Utility Model Patent Application No. 202120438721.6, filed on Mar. 1, 2021.

FIELD

The disclosure relates to a semiconductor device, and more particularly to a light-emitting diode (LED) chip and an ultraviolet light-emitting device including the same.

BACKGROUND

A light-emitting diode (LED) chip is a solid state lighting device that has various advantages such as a long service life, a high reliability, a high photoelectric conversion rate, etc. Brightness of LED chip may be enhanced through improved internal quantum efficiency and improved external quantum efficiency. The external quantum efficiency may be improved by, for instance, using a distributed Bragg reflector (DBR) and a roughened surface to increase light extraction.

In order to increase light emitting efficiency of a LED chip, surface roughening is performed by forming microstructures on a light-exiting surface of the LED chip. The microstructures allow incident light at an angle greater than critical angle to be scattered to exit the LED, and thus amount of light exiting the LED can be increased. However, there is still room for improving the light extraction efficiency of the LED chip achievable by current surface roughening techniques.

In addition, conventionally, LED electrodes account for a large portion of the light-exiting surface of the LED chip, and might undesirably block or reflect light that intends to exit the LED chip. In addition, a substrate or metal layer that is not located on the light-exiting surface might also absorb certain amount of light. These issues adversely reduce light emitting efficiency of the LED chip.

SUMMARY

Therefore, an object of the disclosure is to provide a light-emitting diode (LED) chip and an ultraviolet light-emitting device that can alleviate at least one of the drawbacks of the prior art.

In one aspect of the disclosure, the LED chip includes a substrate which has opposing first and second surfaces, and an epitaxial structure which includes a first semiconductor layer, an active layer and a second semiconductor layer that are sequentially disposed on the first surface in such order. The second semiconductor layer has a light-emitting surface opposite to the active layer, and is formed with a microstructure on the light-emitting surface. The microstructure includes a plurality of first protrusions and a plurality of second protrusions. The first protrusions are separately disposed on the light-emitting surface. The second protrusions are disposed on the first protrusions and on the light-emitting surface between any two adjacent ones of the first protrusions.

In another aspect of the disclosure, the ultraviolet light-emitting device includes the abovementioned LED chip.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1A:
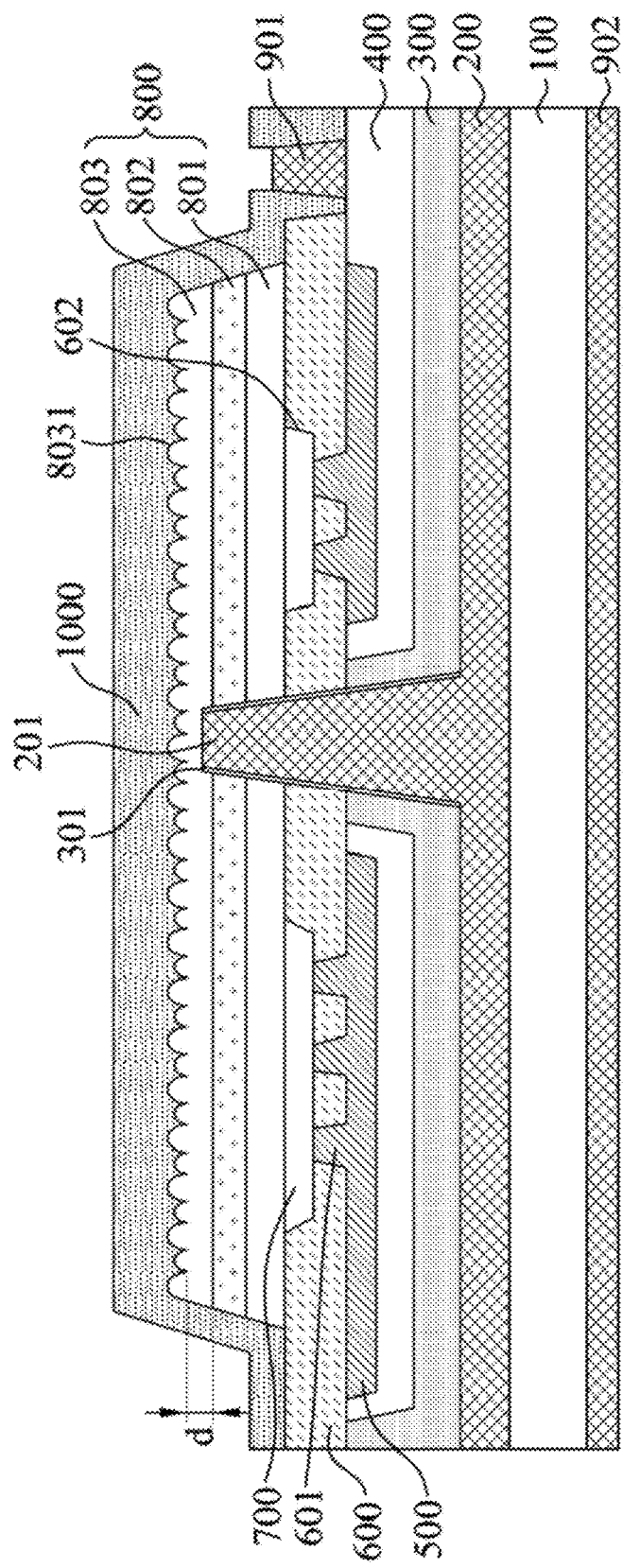
FIG. 1A is a schematic view illustrating an embodiment of a light-emitting diode (LED) chip according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a light-emitting diode (LED) chip of the disclosure includes a substrate 100 and an epitaxial structure 800.

The substrate 100 has opposing first and second surfaces. The substrate 100 may be made of a conducting material, such as a metallic material, or a non-conducting material, such as silicon.

The epitaxial structure 800 includes a first semiconductor layer 801, an active layer 802 and a second semiconductor layer 803 that are sequentially disposed on the first surface of the substrate 100 in such order. The second semiconductor layer 803 has a light-emitting surface opposite to the active layer 802. In certain embodiments, when the LED chip is formed as an ultraviolet light-emitting LED chip, the epitaxial structure 800 is made of AlGaN.

Figure 2:
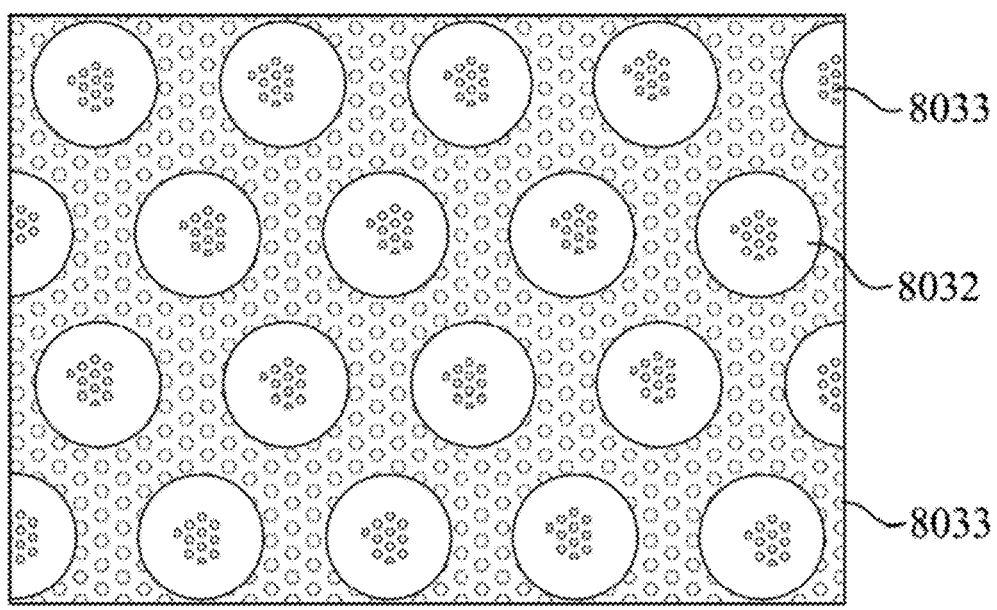
FIG. 2 is a schematic view illustrating microstructures of the embodiment.

Referring to FIGS. 1A and 2, in this embodiment, the second semiconductor layer 803 is formed with a microstructure 8031 on the light-emitting surface. Excluding the microstructure 8031, the second semiconductor layer 803 may have a thickness (d) not less than 1.5 μm. The microstructure 8031 includes a plurality of first protrusions 8032 and a plurality of second protrusions 8033. The first protrusions 8032 are separately disposed on the light-emitting surface. The second protrusions 8033 are disposed on the first protrusions 8032 and on the light-emitting surface between any two adjacent ones of the first protrusions 8032. Specifically, the second protrusions 8033 may be disposed on surfaces of the first protrusions 8032 distal from the light-emitting surface. Each of the first protrusions 8032 may have a volume greater than a volume of each of the second protrusions 8033.

Figure 3:
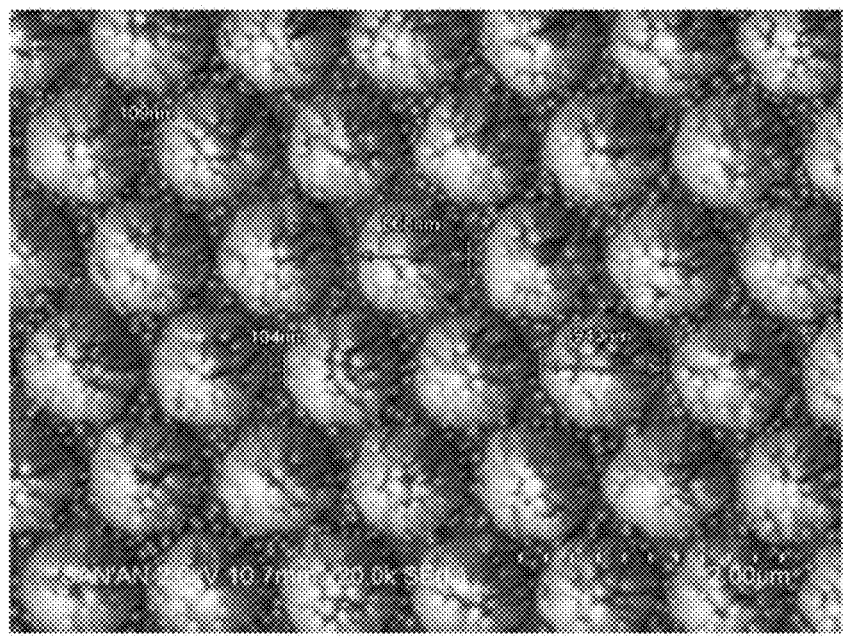
FIG. 3 is a scanning electron microscopy (SEM) image of the microstructures of the embodiment.

The first protrusions 8032 may be spaced apart from each other by a distance not greater than 2 μm. Each of the first protrusions 8032 may protrude away from the light-emitting surface with a height not greater than 1 μm. In this embodiment, each of the first protrusions 8032 is exemplified to be formed in a shape of hemisphere, and a bottom surface of each of the first protrusions 8032 adjacent to the light-emitting surface may have a diameter ranging from 0.8 μm to 1 μm. In certain embodiments, an area of the light-emitting surface occupied by the first protrusions 8032 accounts for less than 50% of a total area of the light-emitting surface. The first protrusions 8032 may be arranged in an array. FIG. 3 shows a scanning electron microscopy (SEM) image of the first protrusions 8032 that are formed in hemispheres and that are arranged uniformly.

The first protrusions 8032 are capable of scattering light such that a majority of the light may be led out of the LED chip through the light-emitting surface. The light-scattering performance of the first protrusions 8032 may be optimized by varying the structure of the first protrusions 8032, and by altering the percentage of the area of the light-emitting surface occupied by the first protrusions 8032 and the percentage of the area of the light-emitting surface between any two adjacent ones of the first protrusions 8032 relative to the total area of the light-emitting surface. The second protrusions 8033 may further scatter the light and reduce internal reflection of light within the epitaxial structure 800, so as to increase light extraction efficiency.

The microstructure 8031 may be obtained by subjecting the light-emitting surface to a roughening process. Specifically, the light-emitting surface may be subjected to an etching process, such as dry etching or wet etching, so as to acquire a high density of the first and second protrusions 8032, 8033 and to control depth of etching, thereby reducing electrical leakage.

The LED chip may further include a conductive bonding layer 200 which is disposed between the substrate 100 and the epitaxial structure 800, and which is electrically connected to the second semiconductor layer 803. The conductive bonding layer 200 may include an extension portion 201 which penetrates through the first semiconductor layer 801, the active layer 802 and a portion of the second semiconductor layer 803, and which is electrically connected to the second semiconductor layer 803. The conductive bonding layer 200 may be made of a metallic material, such as nickel (Ni), aluminum (Al), silver (Ag), gold (Au), or combinations thereof.

The LED chip further includes a first insulating layer 300, an electrode contact layer 400, a metallic reflective layer 500, a current blocking layer 600 and a transparent conducting layer 700 that are sequentially disposed on the conductive bonding layer 200 opposite to the substrate 100 in such order.

The first insulating layer 300 may be made of a material selected from one of $SiO_2$, $TiO_2$, $Ti_2O_3$, $Ti_3O_5$, $Ta_2O_5$, $ZrO_2$, and combinations thereof. In addition, the LED chip may further include a second insulating layer 301 that is disposed on a surrounding surface of the extension portion 201, so that the extension portion 201 is electrically insulated from the first semiconductor layer 801 and the active layer 802. The second insulating layer 301 may be made of a material identical to that of the first insulating layer 300.

The electrode contact layer 400 may be made of a transparent conducting material, or a metallic material such as Ni, Al, Ag and Au.

The metallic reflective layer 500 is adapted to reflect light that is emitted away from the light-emitting surface, so as to reduce light loss, and thus increases light extraction efficiency. The metallic reflective layer 500 may be made of a metal having a high reflectance, such as Ag or Al.

The current blocking layer 600 may be made of a material selected from one of TiO, $TiO_2$, $ZrO_2$, $SiO_2$, SiN, and combinations thereof. The current blocking layer 600 may be formed with a plurality of openings 601 that are filled by the metallic reflective layer 500, so that the metallic reflective layer 500 is electrically connected to the transparent conducting layer 700 (will be discussed in the following paragraph). The openings 601 may correspond in position with the transparent conducting layer 700. In this embodiment, the current blocking layer 600 is further formed with a cavity 602 at a surface proximal to the epitaxial structure 800. The cavity 602 is filled by the transparent conducting layer 700.

The transparent conducting layer 700 is located below the first semiconductor layer 801 opposite to the active layer 802, and is electrically connected to the first semiconductor layer 801. The transparent conducting layer 700 may be made of ITO.

The LED chip may further include a first electrode 901 and a second electrode 902. Each of the first and second electrodes 901, 902 may be independently made of one of Al, Ni, Ti, Pt, Cr, Au, and combinations thereof.

The first electrode 901 may be immediately disposed on the electrode contact layer 400 next to the epitaxial structure 800, and is electrically connected to the first semiconductor layer 801 through the electrode contact layer 400, the metallic reflective layer 500 and the transparent conducting layer 700.

Figure 1B:
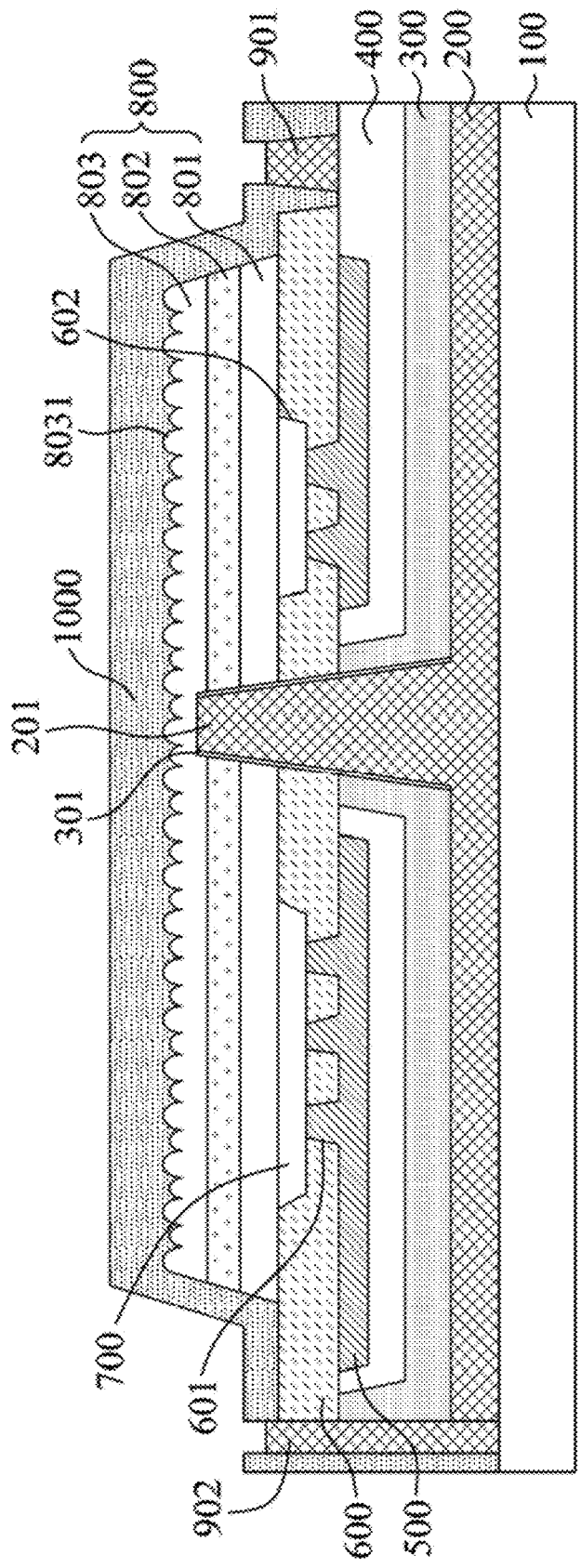
FIG. 1B is a schematic view illustrating a variation of the embodiment of the LED chip according to the disclosure.

In this embodiment, as shown in FIG. 1A, when the substrate 100 is a conductive substrate, the second electrode 902 may be disposed on the second surface of the substrate 100. In a variation of the embodiment, as shown in FIG. 1B, the second electrode 902 may be disposed on the first surface of the substrate 100 and is electrically connected to the conductive bonding layer 200. By virtue of not arranging both the first and second electrodes 901, 902 on the light-emitting surface of the second semiconductor layer 803, light emitted from the active layer 802 through the light-emitting surface is less likely blocked or absorbed by the first and second electrodes 901, 902, and thus is conducive to an enhanced light-emitting efficiency of the LED chip.

The LED chip may further include an insulating protective layer 1000 which covers the epitaxial structure 800 so as to be adjacent to the light-emitting surface of the second semiconductor layer 803. In this embodiment, the insulating protective layer 1000 covers the current blocking layer 600 exposed from the epitaxial structure 800, surroundingly covers the epitaxial structure 800, and extends to a surface of the electrode contact layer 400 exposed from the current blocking layer 600 so as to surround the first electrode 901. The insulating protective layer 1000 may be made of one of $SiO_2$, $TiO_2$, $Ti_2O_3$, $Ti_3O_5$, $Ta_2O_5$, $ZrO_2$, and combinations thereof.

The LED chip according to the disclosure may be used in a high voltage LED unit. The high voltage LED unit may include a plurality of the abovementioned LED chips that are connected in series to each other.

The LED chip according to the disclosure may be formed as an ultraviolet (UV) light-emitting LED chip so as to be applied in an UV light-emitting device for UV sterilization, or for UV solidification. For instance, the IV light-emitting device may be used to irradiate on water or medical apparatus so as to achieve sterilization.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A light-emitting diode (LED) chip, comprising:
   a substrate which has opposing first and second surfaces;
   an epitaxial structure which includes a first semiconductor layer, an active layer and a second semiconductor layer that sequentially disposed on said first surface in such order;
   a conductive bonding layer which is disposed between said substrate and said epitaxial structure, and which is electrically connected to said second semiconductor layer; and
   an electrode contact layer, a metallic reflective layer, a current blocking layer and a transparent conducting layer that are sequentially disposed on said conductive bonding layer opposite to said substrate in such order;
   wherein said second semiconductor layer has a light-emitting surface opposite to said active layer, and is formed with a microstructure on said light-emitting surface, said microstructure including a plurality of first protrusions and a plurality of second protrusions, said first protrusion being separately disposed on said light-emitting surface, said second protrusions being disposed on said first protrusions and on said light-emitting surface between any two adjacent ones of said first protrusions;
   wherein said transparent conducting layer is located below said first semiconductor layer opposite to said active layer and is electronically connected to said first semiconductor layer; and
   wherein said current blocking layer is formed with a plurality of openings, said metallic reflective layer filling said openings to be electronically connected to said transparent conducting layer.

2. The LED chip of claim 1, wherein each of said first protrusions has a volume greater than a volume of each of said second protrusions.

3. The LED chip of claim 1, wherein said second protrusions are disposed on surfaces of said first protrusions distal from said light-emitting surface.

4. The LED chip of claim 1, wherein said first protrusions are arranged in an array.

5. The LED chip of claim 1, wherein said first protrusions are spaced apart from each other by a distance not greater than 2 μm.

6. The LED chip of claim 5, wherein each of said first protrusions protrudes away from said light-emitting surface with a height not greater than 1 μm.

7. The LED chip of claim 1, wherein each of said first protrusions is formed in a shape of hemisphere, and a bottom surface of each of said first protrusions adjacent to said light-emitting surface having a diameter ranging from 0.8 μm to 1 μm.

8. The LED chip of claim 1, wherein an area of said light-emitting surface occupied by said first protrusions accounts for less than 50% of a total area of said light-emitting surface.

9. The LED chip of claim 1, wherein said second semiconductor layer excluding said microstructure has a thickness not less than 1.5 μm.

10. The LED chip of claim 1, wherein said LED chip is formed as an ultraviolet light-emitting LED chip, said epitaxial structure being made of AlGaN.

11. The LED chip of claim 1, wherein said conductive bonding layer penetrates through said first semiconductor layer, said active layer and a portion of said second semiconductor layer to be electronically connected to said second semiconductor layer.

12. The LED chip of claim 1, further comprising a first insulating layer located between said electrode contact layer and said conductive bonding layer.

13. The LED chip of claim 1, further comprising a first electrode which is immediately disposed on said electrode contact layer next to said epitaxial structure.

14. The LED chip of claim 1, wherein said substrate is a conductive substrate, said LED chip further comprising a second electrode which is disposed on said second surface of said substrate.

15. The LED chip of claim 1, further comprising a second electrode which is disposed on said first surface of said substrate and which is electronically connected to said conductive bonding layer.

16. The LED chip of claim 1, further comprising an insulating protective layer which covers said epitaxial structure to be adjacent to said light-emitting surface of said second semiconductor layer.

17. An ultraviolet light-emitting device, comprising an LED chip as claimed in claim 10.

* * * * *